US008916327B2

(12) United States Patent
Takei et al.

(10) Patent No.: US 8,916,327 B2
(45) Date of Patent: *Dec. 23, 2014

(54) UNDERLAYER COATING FORMING COMPOSITION CONTAINING DEXTRIN ESTER COMPOUND

(75) Inventors: Satoshi Takei, Toyama (JP); Yasushi Sakaida, Toyama (JP); Tetsuya Shinjo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 1653 days.

This patent is subject to a terminal disclaimer.

(21) Appl. No.: 10/577,854

(22) PCT Filed: Oct. 29, 2004

(86) PCT No.: PCT/JP2004/016129
§ 371 (c)(1),
(2), (4) Date: Apr. 28, 2006

(87) PCT Pub. No.: WO2005/043248
PCT Pub. Date: May 12, 2005

(65) Prior Publication Data
US 2007/0135581 A1 Jun. 14, 2007

(30) Foreign Application Priority Data
Oct. 30, 2003 (JP) .................. 2003-370354

(51) Int. Cl.
G03F 7/09 (2006.01)
G03F 7/11 (2006.01)
G03F 7/20 (2006.01)
G03F 7/30 (2006.01)

(52) U.S. Cl.
USPC .............. 430/270.1; 430/271.1; 430/311; 430/325; 430/326; 430/330

(58) Field of Classification Search
None
See application file for complete search history.

(56) References Cited

U.S. PATENT DOCUMENTS

| 4,011,392 | A  | * | 3/1977  | Rudolph et al. ............. 536/108 |
| 5,693,691 | A  |   | 12/1997 | Flaim et al.                         |
| 5,919,599 | A  |   | 7/1999  | Meador et al.                        |
| 7,361,718 | B2 | * | 4/2008  | Takei et al. ................ 526/307.5 |
| 2003/0194632 | A1 |   | 10/2003 | Ray et al.                        |

FOREIGN PATENT DOCUMENTS

| EP | 1 035 442 A2 | 9/2000 |
| EP | 1 150 343 A2 | 4/2001 |
| EP | 1 586 945 A1 | 10/2005 |
| JP | A-48-674447 | 9/1973 |
| JP | A-60-223121 | 11/1985 |
| JP | A-61-205494 | 9/1986 |
| JP | A-62-62521 | 3/1987 |
| JP | A-10-215893 | 8/1998 |
| JP | A-2000-294504 | 10/2000 |
| JP | A-2002-47430 | 2/2002 |
| JP | A-2002-107938 | 4/2002 |
| JP | A-2002-128847 | 5/2002 |
| JP | A-2002-190519 | 7/2002 |
| WO | WO 99/56178 A1 | 11/1999 |
| WO | WO 02/05035 A1 | 1/2002 |
| WO | WO 02/071155 A1 | 9/2002 |
| WO | WO 2004/061526 A1 | 7/2004 |

* cited by examiner

Primary Examiner — Sin J. Lee
(74) Attorney, Agent, or Firm — Oliff PLC

(57) ABSTRACT

There is provided an underlayer coating forming composition for lithography, and an underlayer coating having a high dry etching rate compared with photoresist, and causing no intermixing with the photoresist, which are used in lithography process of manufacture of semiconductor device. Concretely, it is an underlayer coating forming composition for lithography comprising a dextrin ester compound that at least 50% of hydroxy groups in dextrin is converted into ester groups, a crosslinking compound, and an organic solvent.

10 Claims, 1 Drawing Sheet

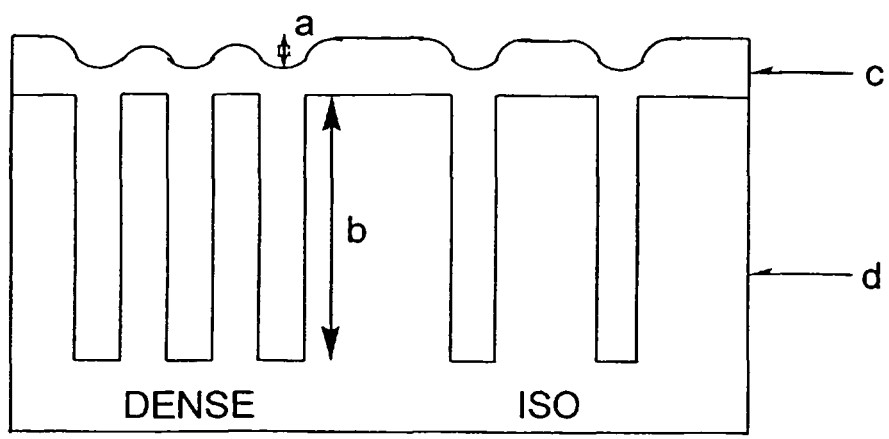

UNDERLAYER COATING FORMING COMPOSITION CONTAINING DEXTRIN ESTER COMPOUND

TECHNICAL FIELD

The present invention relates to a novel composition for forming underlayer coating for lithography, an underlayer coating formed from the composition and a method for forming photoresist pattern by use of the underlayer coating. In addition, the present invention relates to an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; an underlayer coating forming composition for forming the underlayer coating, and a method for forming the underlayer coating. Further, the present invention relates to a composition for forming underlayer coating for lithography that can be used for filling holes formed on a semiconductor substrate.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective film, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of actinic rays from a substrate have become serious problems. Accordingly, it has been widely studied to provide an anti-reflective coating between the photoresist and the substrate (bottom anti-reflective coating) in order to resolve the problem. As the anti-reflective coating, from a viewpoint of easy of use, many considerations have been done on organic anti-reflective coatings made of a light absorbing substance and a polymer compound and the like. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example Patent Documents 1 and 2).

The physical properties desired for organic anti-reflective coating include high absorbance to light and radioactive rays, no intermixing with the photoresist layer (being insoluble in photoresist solvents), no diffusion of low molecular substances from the anti-reflective coating into the topcoat photoresist upon baking under heating, and a higher dry etching rate than the photoresist.

In recent years, in order to solve interconnection delay that has become clear with miniaturization in pattern rule of semiconductor devices, it has been considered to use copper as interconnect material, and to apply Dual Damascene process as interconnect forming method on the semiconductor substrate. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like.

However, it is difficult to apply organic material for anti-reflective coating on a substrate having a high aspect ratio, and in recent years, material with particular emphasis on filling property or flattening property has been developed (see, for example Patent Documents 3, 4, 5 and 6).

In addition, in the production of devices such as semiconductors, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example Patent Document 7).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist. And, in order to satisfy required performance for underlayer coatings for which the diversity is increased, it is always required to develop new underlayer coatings.

In the meantime, an anti-reflective coating forming composition containing a cellulose compound is known (see, for example Patent Documents 8 and 9). Is also disclosed a pattern forming process by use of an a water-soluble anti-reflective organic coating comprising burrane being a polysaccharide as a main component (see, for example Patent Document 10). In addition, an anti-reflective coating material containing a polysaccharide having silyl substituents is disclosed (see, for example Patent Document 11).

Patent Document 1: U.S. Pat. No. 5,919,599 (1999)
Patent Document 2: U.S. Pat. No. 5,693,691 (1997)
Patent Document 3: JP-A-2000-294504 (2000)
Patent Document 4: JP-A-2002-47430 (2002)
Patent Document 5: JP-A-2002-190519 (2002)
Patent Document 6: WO 02/05035 pamphlet
Patent Document 7: JP-A-2002-128847 (2002)
Patent Document 8: WO 99/56178 pamphlet
Patent Document 9: WO 02/071155 pamphlet
Patent Document 10: JP-A-60-223121 (1985)
Patent Document 11: JP-A-2002-107938 (2002)

DISCLOSURE OF INVENTION

Problem to be Solved by the Invention

An object of the present invention is to provide a novel underlayer coating forming composition that can be used for the manufacture of semiconductor devices, and to provide an underlayer coating for lithography that causes no intermixing with a photoresist applied and formed as an upper layer and that has a high dry etching rate compared with the photoresist, and an underlayer coating forming composition for forming the underlayer coating.

Further, another object of the present invention is to provide an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; an underlayer coating forming composition for forming the underlayer coating. Further, an object of the present invention is also to provide a method for forming underlayer coating for lithography by use of the underlayer coating forming composition, and a method for forming a photoresist pattern.

Means for Solving the Problem

Taking the above-mentioned present status into account, the present inventors eagerly investigated, and as a result of it, they found the use of an underlayer coating forming composition containing a dextrin ester compound makes possible to form an excellent underlayer coating, and they completed the present invention.

The present invention relates to the following aspects:

as a first aspect, an underlayer coating forming composition comprising a dextrin ester compound that at least 50% of hydroxy groups in dextrin is converted into ester groups of formula (1):

(1)

wherein $R_1$ is $C_{1-10}$alkyl group that may be substituted with hydroxy group, carboxyl group, cyano group, nitro group, $C_{1-6}$alkoxy group, fluorine atom, chlorine atom, bromine atom, iodine atom or $C_{1-6}$alkoxycarbonyl group, or a phenyl group, a naphthyl group or an anthryl group that may be substituted with $C_{1-6}$alkyl group, hydroxy group, carboxyl group, cyano group, nitro group, $C_{1-6}$alkoxy group, fluorine atom, chlorine atom, bromine atom, iodine atom or $C_{1-6}$alkoxycarbonyl group, a crosslinking compound, and an organic solvent;

as a second aspect, an underlayer coating forming composition comprising a dextrin ester compound that at least 50% of hydroxy groups in dextrin is converted into ester groups of formula (1) wherein $R_1$ has the same meaning as that defined in the first aspect, and that has a weight average molecular weight of 4000 to 20000, a crosslinking compound, and an organic solvent;

as a third aspect, the underlayer coating forming composition as described in the first or two aspect, further comprising an acid compound or an acid generator;

as a fourth aspect, a method for forming photoresist pattern for use in manufacture of semiconductor device, comprising coating the underlayer coating forming composition as described in any one of the first to third aspects on a semiconductor substrate, and baking it to form an underlayer coating, forming a photoresist layer on the underlayer coating, exposing the semiconductor substrate covered with the underlayer coating and the photoresist layer to light, and developing the photoresist layer after the exposure to light; and as a fifth aspect, the underlayer coating forming composition as described in the first or second aspect, in which the composition is used for forming an underlayer coating by coating the composition on a semiconductor substrate having a hole with an aspect ratio shown in height/diameter of 1 or more, and baking it.

Effect of the Invention

The present invention relates to an underlayer coating forming composition for forming an underlayer coating, which is used in lithography process of manufacture of semiconductor device.

The underlayer coating forming composition of the present invention can attain a high filling property inside holes without occurrence of void (gap). As the composition can fill and flatten unevenness on substrates having holes, the film thickness of photoresists formed thereon can be improved in uniformity. Therefore, good photoresist pattern form can be formed even in the process by use of substrates having holes.

The underlayer coating forming composition of the present invention can provide an excellent underlayer coating that has a high dry etching rate compared with photoresists, and cause no intermixing with photoresists.

In addition, the underlayer coating of the present invention can be used as an anti-reflective coating, a flattening coating, and a coating for preventing contamination of a photoresist layer, etc. Consequently, the present invention enables the formation of photoresist pattern in lithography process of the manufacture of semiconductor device to be carried out easily and in a high accuracy.

BRIEF DESCRIPTION OF DRAWINGS

FIG. 1 is a sectional view of an underlayer coating formed on a semiconductor substrate having holes, in which symbol a is dimple depth of the underlayer coating at the center of the hole, b is depth of hole on the substrate used, c is the underlayer coating, and d is the semiconductor substrate.

BEST MODE FOR CARRYING OUT THE INVENTION

The present invention relates to a novel underlayer coating forming composition for lithography, an underlayer coating formed from the composition, and a method for forming a photoresist pattern by use of the underlayer coating. In addition, the present invention relates to an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; an underlayer coating forming composition for forming the underlayer coating, and a method for forming the underlayer coating. Further, the present invention relates to an underlayer coating forming composition for lithography that can be used for filling holes formed on a semiconductor substrate.

The underlayer coating forming composition of the present invention comprises a dextrin ester compound, a crosslinking compound, and an organic solvent. In addition, the composition can contain an acid compound, an acid generator and a surfactant, or the like as other components. The proportion of the solid content in the underlayer coating forming composition of the present invention is for example 0.1 to 50 mass %, or for example 0.5 to 30 mass %, or for example 5 to 30 mass %. In this specification, the solid content means all components in the underlayer coating forming composition from which the organic solvent is excluded.

In the solid content of the underlayer coating forming composition of the present invention, the dextrin ester compound and the crosslinking compound are essential components. The proportion of the dextrin ester compound is 50 to 99 mass %, or 55 to 95 mass %, or 60 to 90 mass % in the solid content. The proportion of the crosslinking compound is 1 to 50 mass %, 5 to 45 mass %, or 10 to 40 mass % in the solid content.

The dextrin ester compound used in the underlayer coating forming composition of the present invention has a weight average molecular weight of 1000 to 500000, preferably for example 2000 to 50000, for example 3000 to 20000, or 4000 to 10000, or 5000 to 9000.

In order to form a layer being an underlayer coating from the underlayer coating forming composition of the present invention, a baking process is carried out. If components having a low molecular weight are contained in a large amount in the composition, there are problems that apparatuses are polluted with the low molecular weight components sublimated in the baking process. Therefore, it is preferable that the underlayer coating forming composition of the present invention contains a lower amount of the low molecular weight components. It is preferable that the proportion of components having a molecular weight of 3000 or less in the dextrin ester compound used in the underlayer coating forming composition of the present invention is 20% or less, or 10% or less.

In addition, if the weight average molecular weight of the dextrin ester compound is larger than the above-mentioned upper limit, the solubility in organic solvents is reduced, and the viscosity of the resulting solution rises, and thus, the underlayer coating forming composition does not lead to sufficient filling property by which the underlayer coating forming composition is filled into holes, or sufficient flattening property by which the substrate is flatted.

The dextrin ester compound used in the underlayer coating forming composition of the present invention is a dextrin ester compound that at least 50% of total hydroxy groups contained in dextrin is converted into ester groups of formula (1):

(1)

The dextrin is compound with a number of hydroxy groups having a high molecular weight, and has a low solubility in organic solvents. Therefore, it is difficult to use it in underlayer coating forming compositions by using organic solvents. The dextrin ester compound used in the underlayer coating forming composition of the present invention is a compound obtained by esterifying the hydroxy groups of the dextrin and thereby is improved in solubility in organic solvents. As the dextrin ester compound used in the underlayer coating forming composition of the present invention is required to have a sufficient solubility in organic solvents, it is a dextrin ester compound that at least 50% of total hydroxy groups contained in dextrin is converted into ester groups. The dextrin ester compound used in the underlayer coating forming composition of the present invention is also a dextrin ester compound that at least 60% or at least 70% of total hydroxy groups contained in dextrin is converted into ester groups of formula (1). The present invention can use a dextrin ester compound that 50 to 90%, 60 to 90% or 70 to 80% of total hydroxy groups are ester groups of formula (1), and remaining 10 to 50%, 10 to 40% or 20 to 30% thereof are hydroxy groups. From the standpoint of crosslinkability with the crosslinking compound, it is preferable to use dextrin ester compounds having hydroxy group.

In formula (1), $R_1$ is $C_{1-10}$alkyl group that may be substituted with hydroxy group, carboxyl group, cyano group, nitro group, $C_{1-6}$alkoxy group, fluorine atom, chlorine atom, bromine atom, iodine atom or $C_{1-6}$alkoxycarbonyl group. $R_1$ is also a phenyl group, a naphthyl group or an anthryl group that may be substituted with $C_{1-6}$alkyl group, hydroxy group, carboxyl group, cyano group, nitro group, $C_{1-6}$alkoxy group, fluorine atom, chlorine atom, bromine atom, iodine atom or $C_{1-6}$alkoxycarbonyl group. The alkyl group is for example methyl group, ethyl group, isopropyl group, n-pentyl group, cyclohexyl group and n-octyl group, etc. The alkoxy group is for example methoxy group, ethoxy group, isopropyloxy group and cyclohexyloxy group, etc. The alkoxycarbonyl group is for example methoxycarbonyl group, ethoxycarbonyl group and cyclohexyloxycarbonyl group, etc. $R_1$ is preferably methyl group, ethyl group, n-propyl group, phenyl group and anthryl group, etc.

The dextrin ester compound used in the underlayer coating forming composition of the present invention can be produced for example according to the following procedures. Firstly, starch is hydrolyzed by a known method such as with an acid, an alkali or an enzyme, or by heating to obtain dextrin. The hydrolysis of starch affords dextrin having a straight-chain structure or a branched structure. The known methods include for example those disclosed in JP-A-48-67447 (1773) or JP-A-61-205494 (1986), and the like. In addition, there is known a method disclosed in JP-A-10-215893 (1998) in which hydrolysis with alkali and liquefaction with enzyme are carried out. The molecular weight of dextrin can be controlled by reaction temperature, pH of reaction solution, the amount of enzyme added, and the like. The aimed dextrin can be produced with purification such as treatment with ion exchange resin, preparative column, re-precipitation, or the like.

Further, the conversion of dextrin into dextrin ester compound can be carried out by converting hydroxy group into ester group through a reaction of dextrin with a compound derived from a carboxylic compound such as an acid chloride, an acid bromide, a carbonyl imidazole compound, carboxylic active ester compound and an acid anhydride, etc. For example, the conversion of hydroxy group of dextrin into acetoxy group can be carried out by reacting dextrin with acetyl chloride or acetic anhydride.

For the conversion of hydroxy group into ester group, the following compounds can be used: an acid chloride, an acid bromide, a carbonyl imidazole compound, and carboxylic active ester compound, etc. derived from carboxylic compounds such as acetic acid, propionic acid, butyric acid, cyclohexane carboxylic acid, chloroacetic acid, trifluoroacetic acid, cyanoacetic acid, ethoxyacetic acid, isobutyric acid, benzoic acid, bromobenzoic acid, hydroxybenzoic acid, iodobenzoic acid, nitrobenzoic acid, methylbenzoic acid, ethoxybenzoic acid, tert-butoxybenzoic acid, naphthalene carboxylic acid, chloronaphthalene carboxylic acid, hydroxynaphthalene carboxylic acid and anthracene carboxylic acid, etc. In addition, the anhydrides of these carboxylic compounds can be also used. Further, the conversion of hydroxy group on dextrin into ester group can be carried out by reacting dextrin with the above-mentioned carboxylic compound in presence of a condensation agent such as dicyclohexylcarbodiimide.

In the conversion of hydroxy group into ester group, carboxylic acid derivatives such as an acid chloride, an acid bromide, a carbonyl imidazole compound, carboxylic active ester compound and an acid anhydride, etc. can be used alone or in a combination of two or more.

The proportion of the conversion of hydroxy group into ester group can be controlled by altering the equivalent weight of a compound derived from carboxylic acid derivatives such as an acid chloride, an acid bromide, a carbonyl imidazole compound, carboxylic active ester compound and an acid anhydride, etc. that is used.

The measurement of the remaining amount of hydroxy groups on dextrin can be carried out by determining the end point at inflection point of pH 8-11 with a pH meter for example by use of 1 N sodium hydroxide aqueous solution.

The dextrin ester compound used in the underlayer coating forming composition of the present invention includes a compound having a straight-chain structure and a compound having a branched structure. Both compounds can be used. The branched structure originates from branched structure (amylopectin) of starch.

The underlayer coating forming composition of the present invention contains a crosslinking compound. Therefore, when baking is carried out in order to form an underlayer coating after applying the underlayer coating forming composition on a substrate, crosslinking reaction takes place. The crosslinking reaction affords a tough underlayer coating that has a low solubility in organic solvents generally used for photoresist compositions or anti-reflective coating forming compositions, such as ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate and butyl lactate, etc. Therefore, the underlayer coating formed from the underlayer coating forming composition of the present invention occurs no intermixing with photoresist or anti-reflective coating formed thereon.

Such crosslinking compounds are not specifically limited, and crosslinking compounds having at least two crosslink-forming substituents are preferably used. The crosslinking compounds having two or more, for example 2 to 6 crosslink-forming substituents such as isocyanate group, epoxy group, hydroxymethylamino group and alkoxymethylamino group, or the like can be used. The crosslinking compounds include nitrogen-containing compounds having two or more, for example 2 to 6 nitrogen atoms substituted with hydroxymethyl group or alkoxymethyl group. In addition, they include nitrogen-containing compounds having nitrogen atoms substituted with hydroxymethyl group, methoxymethyl group, ethoxymethyl group, butoxymethyl group and hexyloxymethyl group, or the like. The concrete compounds include nitrogen-containing compounds such as hexamethoxymethyl melamine, tetramethoxymethyl benzoguanamine, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc. The crosslinking compounds that can be used also include commercially available compounds such as methoxymethyl type melamine compounds manufactured by Mitsui Cytec Co., Ltd. (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (trade name: Beckamine J-300S, Beckamine P-955, Beckamine N) and the like. In addition, the crosslinking compounds that can be used include polymers produced by use of acrylamide compounds or methacrylamide compounds substituted with hydroxymethyl group or alkoxymethyl group, such as N-hydroxymethylacrylamide, N-methoxymethylmethacrylamide, N-ethoxymethylacrylamide, and N-butoxymethylmethacrylamide, etc.

The crosslinking compounds can be used alone or in a combination of two or more. These crosslinking compounds can take place a crosslinking reaction by self-condensation. In addition, they can take place a crosslinking reaction with a hydroxy group contained in the dextrin ester compound.

The underlayer coating forming composition of the present invention can contain an acid compound such as p-toluene sulfonic acid, trifluoromethane sulfonic acid, pyridinium-p-toluenesulfonate, salicylic acid, sulfosalicylic acid, citric acid, benzoic acid, ammonium dodecylbenzenesulfonate, and hydroxy benzoic acid, etc., as a catalyst for accelerating the above-mentioned crosslinking reaction. The acid compounds also include aromatic sulfonic acid compounds such as p-toluene sulfonic acid, pyridinium-p-toluenesulfonate, sulfosalicylic acid, 4-chlorobenzenesulfonic acid, 4-hydroxybenzenesulfonic acid, benzenesulfonic acid, 1-naphthalenesulfonic acid, and pyridinium-1-naphthalenesulfonic acid, etc. In addition, the acid generators such as 2,4,4,6-tetrabromocyclohexadienone, benzointosylate, 2-nitrobenzyltosylate, bis(4-tert-butylphenyl)iodonium trifluoromethanesulfonate, triphenylsulfonium trifluoromethanesulfonate, phenyl-bis(trichloromethyl)-s-triazine, benzointosylate, and N-hydroxysuccinimide trifluoromethanesulfonate, and the like can be added.

The added amount of these acid compounds or acid generators varies depending on the kind of the dextrin ester compound and the crosslinking compound and the amount thereof, and the like, but it is 10 mass % or less, for example 0.02 to 10 mass %, or 0.04 to 8 mass %, or 0.1 to 5 mass %, or 0.5 to 3 mass % in the solid content.

In the underlayer coating forming composition of the present invention, light absorbing compounds, surfactants, rheology controlling agents, and adhesion auxiliaries, etc. can be added when needed, in addition to the above-mentioned components.

The light absorbing compounds can be used without any limitation so long as they have a high absorption for light at photosensitive characteristic wavelength region of photosensitive components in a photoresist layer provided on the underlayer coating.

The light absorbing compounds having a high absorption for light at wavelength 248 nm include for example 1-naphthalene carboxylic acid, 2-naphthol, 3-hydroxy-2-naphthalene carboxylic acid, 3,7-dihydroxy-2-naphthalene carboxylic acid, 6-bromo-2-hydroxynaphthalene, 1,3-naphthalene dicarboxylic acid, 2,6-naphthalene dicarboxylic acid, 1,2-dihydroxynaphthalene, 1,3-dihydroxynaphthalene, 2,6-dihydroxynaphthalene, 2,7-dihydroxynaphthalene, 1-bromo-2-hydroxy-3-naphthalene carboxylic acid, 1,6-dibromo-2-hydroxy-3-naphthalene carboxylic acid, 3-hydroxy-7-methoxy-2-naphthalene carboxylic acid, 1,4,5,8-naphthalene tetracaqrboxylic acid, 3,5-dihydroxy-2-naphthalene carboxylic acid, 2-ethoxy-1-naphthalene carboxylic acid, 2,6-dichloro-1-naphthol, 6-hydroxy-2-naphthalene carboxylic acid methyl ester, 3-hydroxy-7-methoxy-2-naphthalene carboxylic acid methyl ester, 3,7-dihydroxy-2-naphthalene carboxylic acid methyl ester, 2,4-dibromo-1-naphthol, 2-naphthalenethiol, 4-methoxy-1-naphthol, 6-acetoxy-2-naphthalene carboxylic acid, 1,6-dibromo-1-naphthol, 2,6-dibromo-1,5-dihydroxynaphthalene, 1-acetyl-2-naphthol, 9-anthracene carboxylic acid, 1,4,9,10-tetrahydroxyanthracene, 1,8,9-trihydroxyanthracene and the like.

The light absorbing compounds having a high absorption for light at wavelength 193 nm include for example benzoic acid, o-phthalic acid, 2-methoxybenzoic acid, isophthalic acid, terephthalic acid, 2-hydroxybenzoic acid, 2-acetoxybenzoic acid, 3-aminobenzoic acid, 4-aminobenzoic acid, trimesic acid, 1,4-benzenedicarboxylic acid, 2,3-dimethoxybenzoic acid, 2,6-dihydroxybenzoic acid, 3,4-dihydroxybenzoic acid, 4-acetylbenzoic acid, pyromellitic acid, trimesic acid anhydride, 2-[bis-(4-hydroxyphenyl)-methyl]benzoic acid, 3,4,5-trihydroxybenzoic acid, 2-benzophenone carboxylic acid, m-phenylbenzoic acid, 3-(4'-hydroxyphenoxy)benzoic acid, 3-phenoxybenzoic acid, 4-methylphenol, 1,3,5-trihydroxybenzene, 2,2-bis-4-hydroxyphenylpropane, 2-hydroxybiphenyl, 2-aminophenol, and 4-benzyloxyphenol, etc.

In order to prevent sublimation by baking on formation of an underlayer coating, compounds obtained by reacting these light absorbing compounds with a polymer or a compound having one or more reactive groups can be used. For example, in case where light absorbing compounds having a carboxyl group or a phenolic hydroxy group are used, the compounds obtained by reacting them with an epoxy compound such as tris(2,3-epoxypropyl)isocyanurate, 1,4-butanedioldiglycidyl ether, glyceroltriglycidyl ether, diethylene glycol diglycidyl ether, 2,6-diglycidylphenylglycidyl ether, 1,1,3-tris(p-(2,3-epoxypropoxy)phenyl)propane, 1,2-cyclohexane dicarboxylic diglycidyl ester, 4,4'-methylenebis(N,N-diglycidylaniline), 3,4-epoxycyclohexylmethyl-3,4-epoxycyclohexane carboxylate, trimethylolethanetriglycidyl ether, bisphenol-A-diglycidyl ether, and pentaerythritol polyglycidyl ether, etc., or a polymer with structure having an epoxy group, such as glycidyl methacrylate, etc. can be used. For example, the above-mentioned compounds include polymers having the unit structure of the following formulae (2), (3) and (4), and the compound of formula (5). In formula (5), Ar is benzene ring, naphthalene ring or anthracene ring that may be substituted by $C_{1-5}$ alkyl group, $C_{1-5}$ alkoxy group, fluorine atom, chlorine atom, bromine atom, iodine atom, nitro group, cyano group, hydroxy group, thiol group, $C_{1-5}$ thioalkyl group, carboxyl group, phenoxy group, acetyl group, $C_{1-5}$ alkoxycarbonyl group or vinyl group.

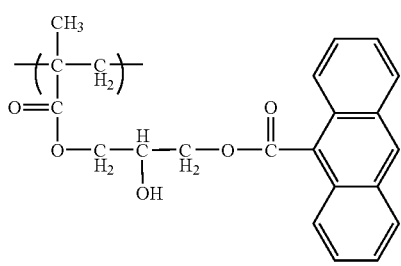

(2)

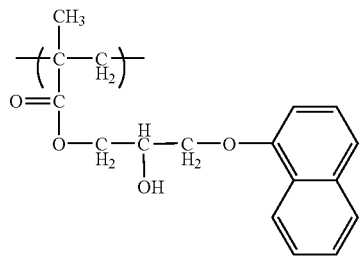

(3)

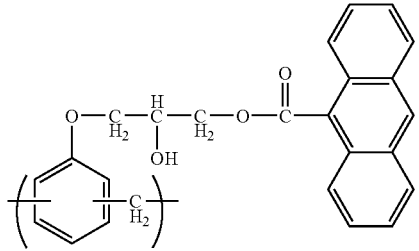

(4)

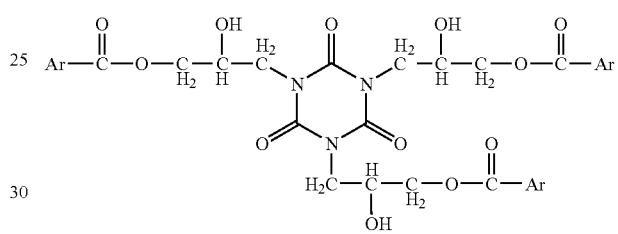

(5)

The above-mentioned light absorbing compounds can be used alone or in a combination of two or more compounds. When the light absorbing compounds are used, the content is for example 1 to 300 mass parts or 2 to 200 mass parts or for example 5 to 100 mass parts or 5 to 50 mass parts based on 100 mass parts of the dextrin ester compound. When the light absorbing compounds are used, the attenuation coefficient (k) of the underlayer coating can be controlled by altering the kind or content thereof.

The underlayer coating forming composition of the present invention may contain surfactants. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.2 mass % or less, preferably 0.1 mass % or less in all components of the underlayer coating forming composition according to the present invention. The surfactants may be added singly or in combination of two or more.

The underlayer coating forming composition of the present invention may contain rheology controlling agents, adhesion auxiliaries, etc., if necessary.

The rheology controlling agents include for example dimethyl phthalate, diethyl phthalate, diisobutyl phthalate, dihexyl phthalate, butyl isodecyl phthalate, di-n-butyl adipate, diisobutyl adipate, diisooctyl adipate, octyldecyl adipate, di-n-butyl maleate, diethyl maleate, dinonyl maleate, methyl oleate, butyl oleate, tetrahydrofurfuryl oleate, n-butyl stearate, and glyceryl stearate, etc.

The adhesion auxiliaries include for example trimethylchlorosilane, dimethylvinylchlorosilane, chloromethyldimethyl chlorosilane, trimethylmethoxysilane, dimethyldiethoxysilane, dimethylvinylethoxysilane, γ-methacryloxypropyltrimethoxysilane, diphenyldimethoxysilane, phenyltriethoxysilane, hexamethyldisilazane, N,N'-bis(trimethylsilyl)urea, dimethyltrimethylsilylamine, trimethylsilylimidazole, γ-chloropropyltrimethoxysilane, γ-aminopropyltriethoxysilane, γ-glycidoxypropyltrimethoxysilane, γ-methacryloxypropyltrimethoxysilane, benzotriazole, benzimidazole, indazole, imidazole, 2-mercaptobenzimidazole, 2-mercaptobenzothiazole, 2-mercaptobenzoxazole, urazole, thiouracyl, mercaptoimidazole, mercaptopyrimidine, 1,1-dimethylurea, 1,3-dimethylurea and thioureas, etc.

As an organic solvent for the underlayer coating forming composition of the present invention, solvents that dissolve solid contents such as the above-mentioned dextrin ester compound and the like to give a homogeneous solution can be used. Such organic solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, etc. These solvents may be used singly or in combination of two or more of them. Further, high boiling solvents such as propylene glycol monobutyl ether or propylene glycol monobutyl ether acetate, etc. may be mixed and used.

As the underlayer coating forming composition of the present invention is applied on a substrate and baked, it is preferable that the boiling point of the organic solvents ranges from 145 to 220° C. in consideration of baking temperature. The use of solvents having a relatively low boiling point can afford the maintenance of fluidity of the underlayer coating forming composition for a certain period of time while baking is carried out, and thereby filling property into holes and flattening property can be improved. Among the above-mentioned organic solvents, butyl lactate, propylene glycol monobutyl ether, propylene glycol monomethyl ether acetate, cyclohexanone, diethylene glycol monomethyl ether or a mixture thereof.

Hereinafter, the utilization of the underlayer coating forming composition of the present invention is described.

Semiconductor substrates on which the underlayer coating forming composition of the present invention is applied are substrates having holes of an aspect ratio shown in height/diameter of 1 or more as shown in FIG. 1 that are commonly used for the manufacture of semiconductor devices (for example, silicon wafer substrate, silicon/silicon dioxide coat substrate, silicon nitride substrate, glass substrate, ITO substrate or the like). The semiconductor substrates having holes are used particularly in dual damascene process. In addition, the underlayer coating forming composition can be also used for semiconductor substrates having holes of aspect ratio less than 1 or semiconductor substrates having steps. Further, the underlayer coating forming composition can be used for semiconductor substrates having no step or the like.

On a semiconductor substrate, the underlayer coating forming composition of the present invention is coated by a suitable coating method, for example, with a spinner, a coater or the like, and thereafter the substrate is baked to fabricate an underlayer coating. The conditions of baking are suitably selected from baking temperature of 60 to 220° C. and baking time of 0.3 to 60 minutes. Preferably the baking temperature is 130 to 250° C. and the baking time is 0.5 to 5 minutes. The thickness of the underlayer coating is for example 0.01 to 3.0 µm, or for example 0.03 to 1.0 µm.

Next, a photoresist layer is formed on the underlayer coating. The formation of the photoresist layer can be conducted by well-known process, that is, by application of a photoresist composition solution on the underlayer coating and baking.

The photoresist to be coated and formed on the underlayer coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned.

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern. The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. Further, surfactants can be added in these developers. The condition of development is suitably selected from a temperature of 5 to 50° C. and a time of 10 to 300 seconds.

Then, removal of the underlayer coating and processing of the semiconductor substrate are conducted by using the photoresist pattern formed as mentioned above as a protective coating. The removal of the underlayer is conducted through dry etching by use of a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, etc.

Before or after forming the underlayer coating of the present invention on a semiconductor substrate, an organic anti-reflective coating layer may be applied and formed. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a polymer and a solvent, one containing as main components a polymer having a light absorbing group through chemical bond, a crosslinking agent and a solvent, one containing as main components a light absorbing compound, a crosslinking agent and a solvent, and one containing as main components a polymer type crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The polymers include polyesters, polyimides, polystyrenes, novolak resins, polyacetals, acrylic polymers, and the like. The polymers having a light absorbing group through chemical bond include polymers having a light absorbing aromatic ring structure such as anthracene ring, naphthalene ring, benzene ring, quinoline ring, quinoxaline ring or thiazole ring.

The semiconductor substrates on which the underlayer coating forming composition of the present invention is applied may be substrates on which an inorganic anti-reflective coating is formed by CVD method or the like, and the underlayer coating of the present invention can be formed thereon.

The underlayer coating formed from the underlayer coating forming composition of the present invention may contain an absorption for light used in the lithography process. In such a case, the underlayer coating can be used as a layer having a preventive effect against light reflected from the substrate, that is, as an anti-reflective coating.

In case where the underlayer coating is used as an anti-reflective coating in the lithography process by use of irradiation light of KrF excimer laser beam (wavelength 248 nm), it is preferable that the solid content in the underlayer coating forming composition contains a component containing an anthracene ring or a naphthalene ring. In case where the underlayer coating is used as an anti-reflective coating in the lithography process by use of irradiation light of ArF excimer laser beam (wavelength 193 nm), it is preferable that the solid content in the underlayer coating forming composition contains a component containing a benzene ring. In case where the underlayer coating is used as an anti-reflective coating in the lithography process by use of irradiation light of F2 excimer laser beam (wavelength 157 nm), it is preferable that the solid content in the underlayer coating forming composition contains a component containing a bromine atom or an iodine atom.

Further, the underlayer coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion and adverse effects of substances formed in the substrate on baking under heating to the upper layer photoresist, and as a barrier layer for reducing any poisoning effect of the photoresist layer by the semiconductor substrate dielectric layer.

In addition, the underlayer coating formed from the underlayer coating forming composition can be used as a filling agent that can fill via holes without gap or as a flattening agent for flattening a substrate surface, by applying it for the substrate on which via holes are formed and which is used in dual damascene process.

Hereinafter, the present invention will be described based on examples but the present invention is not limited thereto.

EXAMPLES

Example 1

In 85.0 g of ethyl lactate solution in which dextrin ester compound AC-3 (proportion of terminal groups of dextrin: hydroxy group 24%, acetoxy group 76%, weight average molecular weight 8100, manufactured by Gunei Chemical Industry Co., Ltd.) was dissolved in a concentration of 30 mass %, 9.23 g of tetramethoxymethylglycoluril, 0.01 g of pyridinium-p-toluenesulfonic acid, 0.129 of surfactant R-30 (manufactured by Dainippon Ink and Chemicals Incorporated), 14.79 g of propylene glycol monomethyl ether, and 73.91 g of ethyl lactate were added to obtain 18.0 mass % solution. Thereafter, the solution was filtered through a micro filter made of polyethylene having a pore diameter of 0.05 μm to prepare an underlayer coating forming composition solution.

In the meanwhile, the proportion of terminal groups of dextrin: hydroxy group 24%, acetoxy group 76% means that 76% of the total number of hydroxy groups contained in dextrin is converted into acetoxy groups, and the remaining 24% is hydroxy group. The weight average molecular weight of the dextrin ester compound was determined by measurement through GPC analysis in terms of standard polystyrene with GPC (RI8020, SD8022, CO8020, AS8020, DP8020) apparatus manufactured by Tosoh Corporation. The measurement was carried out by flowing 10 μl of 0.05 mass % DMF solution of dextrin ester compound in the above-mentioned apparatus at a flow amount of 0.6 ml/min for 30 minutes, and then measuring an elution time of the sample detected by IR. The used columns were Shodex Asahip ak GF1G7B as a guard column and Shodex Asahipak GF710HQ, GF510HQ and GF310HQ as a column. In addition, column temperature was set to 40° C.

Example 2

In 85.0 g of ethyl lactate solution in which dextrin ester compound AC-4 (proportion of terminal groups of dextrin: hydroxy group 32%, acetoxy group 68%, weight average molecular weight 8900, manufactured by Gunei Chemical Industry Co., Ltd.) was dissolved in a concentration of 30 mass %, 9.23 g of tetramethoxymethylglycoluril, 0.01 g of pyridinium-p-toluenesulfonic acid, 0.129 of surfactant R-30 (manufactured by Dainippon Ink and Chemicals Incorporated), 14.79 g of propylene glycol monomethyl ether, and 73.91 g of ethyl lactate were added to obtain 18.0 mass % solution. Thereafter, the solution was filtered through a micro filter made of polyethylene having a pore diameter of 0.05 μm to prepare an underlayer coating forming composition solution.

Example 3

In 85.0 g of ethyl lactate solution in which dextrin ester compound AC-3 (proportion of terminal groups of dextrin: hydroxy group 24%, acetoxy group 76%, weight average molecular weight 8100, manufactured by Gunei Chemical Industry Co., Ltd.) was dissolved in a concentration of 30 mass %, 9.23 g of tetramethoxymethylglycoluril, 0.0271 g of ammonium dodecylbenzenesulfonate, 0.129 of surfactant R-30 (manufactured by Dainippon Ink and Chemicals Incorporated), 14.79 g of propylene glycol monomethyl ether, and 73.91 g of ethyl lactate were added to obtain 18.0 mass % solution. Thereafter, the solution was filtered through a micro filter made of polyethylene having a pore diameter of 0.05 μm to prepare an underlayer coating forming composition solution.

Example 4

In 10.0 g of ethyl lactate solution in which dextrin ester compound BZ-1 (proportion of terminal groups of dextrin: hydroxy group 13%, benzoate group 87%, weight average molecular weight 7300, manufactured by Gunei Chemical Industry Co., Ltd.) was dissolved in a concentration of 31 mass %, 1.09 g of tetramethoxymethylglycoluril, 0.00546 g of pyridinium-p-toluenesulfonic acid, 0.0153 of surfactant R-30 (manufactured by Dainippon Ink and Chemicals Incorporated), 5.26 g of propylene glycol monomethyl ether, and 5.32 g of ethyl lactate were added to obtain 18.0 mass % solution. Thereafter, the solution was filtered through a micro filter made of polyethylene having a pore diameter of 0.05 μm to prepare an underlayer coating forming composition solution.

Example 5

In 10.0 g of ethyl lactate solution in which dextrin ester compound BZ-4 (proportion of terminal groups of dextrin: hydroxy group 27%, benzoate group 63%, weight average molecular weight 6000, manufactured by Gunei Chemical Industry Co., Ltd.) was dissolved in a concentration of 31 mass %, 1.11 g of tetramethoxymethylglycoluril, 0.0055 g of pyridinium-p-toluenesulfonic acid, 0.0155 of surfactant R-30 (manufactured by Dainippon Ink and Chemicals Incorporated), 5.32 g of propylene glycol monomethyl ether, and 5.52 g of ethyl lactate were added to obtain 2.0 mass % solution. Thereafter, the solution was filtered through a micro filter made of polyethylene having a pore diameter of 0.05 μm to prepare an underlayer coating forming composition solution.

Dissolution Test in Photoresist Solvent

The underlayer coating forming composition solutions obtained in Examples 1 to 5 were coated on silicon wafer substrates by means of a spinner, respectively. The coated silicon wafer substrates were baked at 205° C. for 1 minute on a hot plate to form underlayer coatings (film thickness 0.50 μm). The underlayer coatings were dipped in ethyl lactate, propylene glycol monomethyl ether acetate, and propylene glycol monomethyl ether that are solvents used for photoresists, and as a result it was confirmed that the resulting underlayer coatings were insoluble in these solvents.

Test of Intermixing with Photoresist

The underlayer coating forming composition solutions obtained in Examples 1 to 5 were coated on silicon wafer substrates by means of a spinner, respectively. The coated silicon wafer substrates were baked at 205° C. for 1 minute on a hot plate to form underlayer coatings (film thickness 0.50 μm). On each underlayer coating was coated a commercially available photoresist solution (trade name: GARS 8105G1 manufactured by Fuji Photo Film Co., Ltd. and trade name: SEPR 430 manufactured by Shinetsu Chemical Co., Ltd.) by means of a spinner. The coated wafers were heated at 90° C. or 110° C. for 1.5 minute on a hot plate. After exposure of the photoresists to light, post exposure bake was performed at 90° C. for 1.5 minute. After developing the photoresists, the film thickness of the underlayer coatings was measured and it was confirmed that no intermixing occurred between the underlayer coatings and the photoresist layers.

Test of Flattening Rate and Filling Property

The underlayer coating forming composition solutions obtained in Examples 1 to 5 were coated on silicon dioxide (SiO$_2$) wafer substrates having holes (diameter: 0.18 μm, depth: 1.0 μm) by means of a spinner, respectively. The used substrates are SiO$_2$ wafer substrates having Iso (isolated) and Dense (dense) patterns of holes as shown in FIG. 1. Iso pattern is a pattern in which the distance from the center of a hole to the center of the adjacent hole is five times as long as the diameter of the hole. Denso pattern is a pattern in which the distance from the center of a hole to the center of the adjacent hole is one time as long as the diameter of the hole. The depth of the holes is 1.0 μm and the diameter thereof is 0.18 μm.

The coated substrates were baked at 205° C. for 1 minute on a hot plate to form underlayer coatings. The film thickness thereof was 0.50 μm at the open area where hole pattern is not present in the vicinity. The flattening rate by the underlayer coatings was assessed by observing with a scanning electron microscope (SEM) the sectional form of the SiO$_2$ wafer substrates having holes on which the underlayer coating forming compositions of the present invention obtained in Examples 1 to 5 were applied. The flattening rate was calculated according to the following equation. The results are shown in Table 1. The flattening rate was 100% when holes on the substrate were perfectly flattened.

$$\text{Flattening Rate} = [1 - (\text{dimple depth } a \text{ of underlayer coating at the center of holes})/(\text{hole depth } b)] \times 100$$

In addition, no void (gap) was observed inside the holes, and it was observed that the inside of the holes was filled with the underlayer coating.

TABLE 1

| | Film Thickness (nm) | | | Flattening Rate (%) | | |
|---|---|---|---|---|---|---|
| | Iso | Dense | Bias | Iso | Dense | Bias |
| Example 1 | 490 | 350 | 140 | 100 | 100 | 0 |
| Example 2 | 470 | 370 | 100 | 100 | 100 | 0 |
| Example 3 | 510 | 380 | 130 | 100 | 100 | 0 |
| Example 4 | 500 | 310 | 190 | 100 | 100 | 0 |
| Example 5 | 500 | 310 | 190 | 100 | 100 | 0 |

In the underlayer coatings of Examples 1 to 5, difference (Bias) in film thickness on Iso (isolated) and Dense (dense) patterns was small. The underlayer coatings of Examples 1 to 5 were excellent in flowability on fine Dense hole pattern that it was particularly difficult to obtain a constant film thickness. It is assumed that the solution of the underlayer coating forming composition smoothly flows into a plurality of holes even at Dense part having larger hole number (hole density) per unit area on the substrate than Iso part, thereby providing constant film thickness, and that consequently difference in film thickness of Iso part and Dense part becomes small and flattening rate becomes high. Further, the underlayer coatings of Examples 1 to 5 were able to flatten irrespective of Iso part and Dense part.

Measurement of Optical Parameter

The underlayer coating forming composition solution prepared in Example 4 was coated on a silicon wafer substrate by means of a spinner. The coated silicon wafer substrate was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.57 and attenuation coefficient (k) was 0.68.

The underlayer coating forming composition solution prepared in Example 5 was coated on a silicon wafer substrate by means of a spinner. The coated silicon wafer substrate was baked at 205° C. for 1 minute on a hot plate to form an underlayer coating (film thickness 0.20 μm). On the underlayer coating, refractive index (n) and attenuation coefficient (k) at a wavelength of 193 nm were measured with a spectroscopic ellipsometer. As a result of it, refractive index (n) was 1.60 and attenuation coefficient (k) was 0.58.

Measurement of Dry Etching Rate

The underlayer coating forming composition solutions prepared in Examples 1 to 5 were coated on silicon wafer substrates by means of a spinner, respectively. The coated silicon wafer substrates were baked at 205° C. for 1 minute on a hot plate to form underlayer coatings (film thickness 0.22 μm). Then, dry etching rate on these underlayer coatings was measured with RIE system ES401 manufactured by Nippon Scientific Co., Ltd. under the condition in which $CF_4$ was used as dry etching gas. The results are shown in Table 2. The dry etching selectivity corresponds to dry etching rate of an underlayer coating in case where the dry etching rate of the photoresist for ArF excimer laser lithography (trade name: GARS 8105G1 manufactured by Fuji Photo Film Co., Ltd.) under a similar condition as above is regarded as 1.00.

TABLE 2

| | Dry etching selectivity |
|---|---|
| Example 1 | 2.49 |
| Example 2 | 2.50 |
| Example 3 | 2.53 |

TABLE 2-continued

| | Dry etching selectivity |
|---|---|
| Example 4 | 1.39 |
| Example 5 | 1.42 |

It was confirmed that the etching rate of the underlayer coatings obtained from the underlayer coating forming compositions obtained in Examples 1 to 5 was higher that of the photoresists. An underlayer coating is required to have a higher dry etching rate than a photoresist owing to the following reasons: in the process in which the base of the substrate is exposed after development of the photoresist formed on the underlayer coating, the developed photoresist pattern can be transferred to a substrate accurately because the underlayer coating is removed before the photoresist is scraped out as the underlayer coating has a higher dry etching rate than the photoresist.

The invention claimed is:

1. An underlayer coating forming composition comprising a crosslinking compound, an organic solvent and a dextrin ester compound,
wherein at least 50% of hydroxy groups in the dextrin are converted into ester groups of formula (1):

(1)

wherein $R_1$ is $C_{1-10}$alkyl group that may be substituted with a hydroxy group, a carboxyl group, a cyano group, a nitro group, a $C_{1-6}$alkoxy group, a fluorine atom, a chlorine atom, a bromine atom, an iodine atom or a $C_{1-6}$alkoxycarbonyl group; or a phenyl group, a naphthyl group or an anthryl group, each of which may be substituted with a $C_{1-6}$alkyl group, a hydroxy group, a carboxyl group, a cyano group, a nitro group, a $C_{1-6}$alkoxy group, a fluorine atom, a chlorine atom, a bromine atom, an iodine atom or a $C_{1-6}$ alkoxycarbonyl group, and
wherein the underlayer coating composition forms an underlayer coating of a photoresist in a lithography process, and a solid content in the underlayer coating forming composition further comprises at least one light absorbing compound selected from the group consisting of a compound containing an anthracene ring, a compound containing a naphthalene ring, a compound containing a bromine atom, and a compound containing an iodine atom.

2. The underlayer coating forming composition according to claim 1, further comprising an acid compound or an acid generator.

3. A method for forming a photoresist pattern for use in manufacture of a semiconductor device, comprising:
coating the underlayer coating forming composition according to claim 2 on a semiconductor substrate, and baking it to form the underlayer coating;
forming a photoresist layer on the underlayer coating;
exposing the semiconductor substrate covered with the underlayer coating and the photoresist layer to light; and
developing the photoresist layer after the exposure to light.

4. A method for forming a photoresist pattern for use in manufacture of a semiconductor device, comprising:

coating the underlayer coating forming composition according to claim 1 on a semiconductor substrate, and baking it to form the underlayer coating;

forming a photoresist layer on the underlayer coating;

exposing the semiconductor substrate covered with the underlayer coating and the photoresist layer to light; and developing the photoresist layer after the exposure to light.

5. The underlayer coating forming composition according to claim 1, wherein the composition forms the underlayer coating by coating the composition on a semiconductor substrate having a hole with an aspect ratio shown in height/diameter of 1 or more, and baking it.

6. An underlayer coating forming composition comprising a crosslinking compound, an organic solvent and a dextrin ester compound, wherein at least 50% of hydroxy groups in the dextrin is converted into ester groups of formula (1):

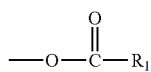

(1)

wherein $R_1$ is a $C_{1-10}$ alkyl group that may be substituted with a hydroxy group, a carboxyl group, a cyano group, a nitro group, a $C_{1-6}$ alkoxy group, a fluorine atom, a chlorine atom, a bromine atom, a iodine atom or a $C_{1-6}$ alkoxycarbonyl group; or a phenyl group, a naphthyl group or an anthryl group, each of which may be substituted with $C_{1-6}$ alkyl group, hydroxy group, carboxyl group, cyano group, nitro group, $C_{1-6}$ alkoxy group, fluorine atom, chlorine atom, bromine atom, iodine atom or $C_{1-6}$ alkoxycarbonyl group, and wherein the dextrin ester compound has a weight average molecular weight of 4,000 to 20,000, and wherein the underlayer coating composition forms an underlayer coating of a photoresist in a lithography process, and a solid content in the underlayer coating forming composition further comprises at least one light absorbing compound selected from the group consisting of a compound containing an anthracene ring, a compound containing a naphthalene ring, a compound containing a bromine atom, and a compound containing an iodine atom.

7. The underlayer coating forming composition according to claim 6, further comprising an acid compound or an acid generator.

8. A method for forming a photoresist pattern for use in manufacture of a semiconductor device, comprising:

coating the underlayer coating forming composition according to claim 7 on a semiconductor substrate, and baking it to form the underlayer coating;

forming a photoresist layer on the underlayer coating;

exposing the semiconductor substrate covered with the underlayer coating and the photoresist layer to light; and developing the photoresist layer after the exposure to light.

9. A method for forming a photoresist pattern for use in manufacture of a semiconductor device, comprising:

coating the underlayer coating forming composition according to claim 6 on a semiconductor substrate, and baking it to form the underlayer coating;

forming a photoresist layer on the underlayer coating;

exposing the semiconductor substrate covered with the underlayer coating and the photoresist layer to light; and developing the photoresist layer after the exposure to light.

10. The underlayer coating forming composition according to claim 6, wherein the composition forms the underlayer coating by coating the composition on a semiconductor substrate having a hole with an aspect ratio shown in height/diameter of 1 or more, and baking it.

\* \* \* \* \*